Figure 1:
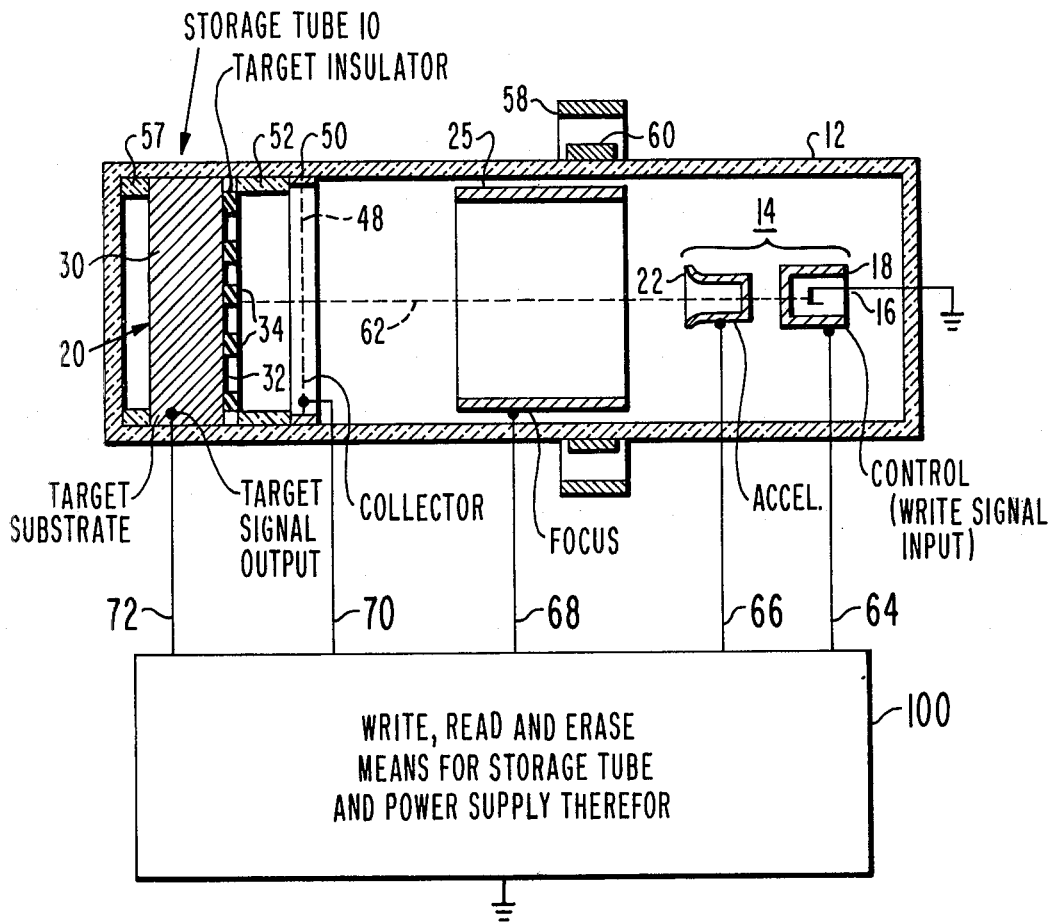

United States Patent [19]

Smith

[11] 3,950,669

[45] Apr. 13, 1976

[54] ERASING METHOD FOR STORAGE TUBE EMPLOYING RASTER SCAN

[75] Inventor: Edgar Merle Smith, Millersville, Pa.
[73] Assignee: RCA Corporation, New York, N.Y.
[22] Filed: Apr. 24, 1974
[21] Appl. No.: 463,604

[52] U.S. Cl. .......... 315/12 R; 315/11; 340/173 CR; 313/395
[51] Int. Cl.² ......................................... H01J 29/41
[58] Field of Search ......................... 315/10, 11, 12; 340/173 CR; 313/395

[56] References Cited
UNITED STATES PATENTS

| | | |
|---|---|---|
| 3,331,983 | 7/1967 | Hesse .................................. 313/395 |
| 3,710,173 | 1/1973 | Hutchins et al. ...................... 315/12 |
| 3,751,688 | 8/1973 | Hooghordel ................... 340/173 CR |
| 3,753,129 | 8/1973 | Janko .................................... 315/12 |
| 3,831,054 | 8/1974 | Dorsey et al. ......................... 315/12 |

Primary Examiner—Richard A. Farley
Assistant Examiner—G. E. Montone
Attorney, Agent, or Firm—Edward J. Norton; George J. Seligsohn

[57] ABSTRACT

The time duration of an erasing cycle is shortened and "raster burn" is reduced by first applying potentials which result in a substantially uniform charge over the storage surface by means of secondary electron redistribution. This causes the storage target surface to assume a substantially uniform "white" level. Thereafter, the charge on the storage target surface is reduced to a substantially uniform "black" level.

8 Claims, 2 Drawing Figures

ERASING METHOD FOR STORAGE TUBE EMPLOYING RASTER SCAN

This invention relates to a method for operating a storage tube and, more particularly, to a method for erasing electrical charges manifesting stored information present on the surface of the storage target of a storage tube.

Storage tubes and methods for operating them are known in the art and, for example, are described in U.S. Pat. No. 2,859,376 and U.S. Pat. No. 3,675,134. As known, a storage tube includes an electron gun for producing an electron beam which is directed toward a storage target. The target comprises an insulating layer disposed on a conductive substrate. The storage tube also includes a collector electrode for collecting secondary electrons which may be emitted by the insulating layer in response to the electron beam impacting thereon. The storage target may also include a grid-like metallic element disposed on or in proximity to the exposed surface of the insulating layer for dividing the insulating layer into elemental areas and for obtaining a signal output upon readout of the stored information.

As known in the art, by appropriately deflecting the electron beam and by appropriately controlling the potentials, relative to the electron-gun cathode potential, applied to a control electrode of the electron gun, the collector electrode and the target substrate, a storage tube may be operated alternatively in a write mode, a read mode or an erase mode. In the write mode, a pattern formed by non-uniformly distributed electrical charges is written on the surface of the target by the impacting electron beam. This pattern may manifest either stored binary information (as disclosed in the aforesaid U.S. Pat. No. 2,359,376) or may manifest stored analog information, such as a picture having a gray scale, (as disclosed in the aforesaid U.S. Pat. No. 3,675,134). While deflection of the electron beam to provide random access to any spot on the surface of the storage target is often employed in the storage of binary information, the deflection of the electron beam employed for the storage of analog information, such as a picture, is usually a raster scan of the electron beam similar to that employed in television.

As is known, in the read mode, the stored information may be non-destructively read out many times. The time required to either write in information or to read out information is quite short, and therefore, provides no problem. However, the time required to erase the non-uniformly distributed electrical charges manifesting stored information which have already been written on the surface of the storage target tends to be quite long and is a problem. The disclosures of both the aforesaid U.S. Pat. Nos. 2,859,376 and 3,675,134 consider aspects of this problem in regard to binary-information storage and analog (picture) information storage, respectively.

The present invention is directed to an improved method for solving this problem of erasing stored information from the surface of a storage target of a storage tube which utilizes raster scanning of the electron beam thereof. Thus, although not limited thereto, the method of the present invention is particularly suitable for erasing stored pictorial information having a gray scale.

Erasing the stored information from the storage surface of a storage tube, such as a silicon target storage tube, is usually accomplished by switching the target substrate voltage slightly (e.g. approximately 6 volts) more positive than the read mode target substrate voltage. As the electron beam scans the target, (usually at conventional television rates), the surface of the storage target changes toward cathode potential because the secondary emission ratio is less than unity. In this case, it is often necessary to scan the surface of the storage target a relatively large number of times (e.g. 15) before the previous information is erased and the storage surface is uniformly charged to cathode potential, so that when the target substrate voltage is switched back to that employed in the read mode, the display is at a uniform "black" level. At conventional television rates, the target must often be scanned for approximately one-half second to reduce the residual signal to a level that would not be objectionable in a gray-scale display.

A further problem, heretofore encountered in erasing the storage surface of a storage tube employing raster-scan of its electron beam, is that the storage surface permanently changes its characteristic after a few hours of normal operation, producing what is called a "raster burn". This is particularly apparent if the position and area is changed. The erasing method of the present invention greatly reduces this undesired "raster burn."

Briefly, in accordance with the method of the present invention, a different respective one of a first set of predetermined potentials, relative to the potential of the storage tube cathode, is individually applied to the control electrode, the collector electrode and the storage target of the storage tube for a first integral number of scanning frames of the surface of the target. The predetermined potentials of the first set are selected to cause non-uniformly distributed electrical charges manifesting stored information which have already been written on the surface of the storage target to be essentially eliminated, and the surface to assume a substantially uniform charge over the surface of the storage target by means of secondary electron redistribution. This results in the storage target assuming a substantially uniform "white" level of stored electrical charges.

Then, a different respective one of a second set of predetermined potentials, relative to the potential of the storage tube cathode, is individually applied to the control electrode, the collector electrode and the storage target for a second integral number of scanning frames. The predetermined potentials of the second set are selected to cause the stored electrical charges to be substantially dissipated from a storage target to thereby result in the storage target assuming a substantially uniform "black" level.

In practice, the first integral number of scanning frames, during which the first set of predetermined potentials is employed, is usually only one frame, while the second integral number, during which the second set of predetermined potentials is employed, is usually a relatively small plural number of frames, such as five. Thus, by employing the present invention, the total erasing time may be significantly reduced from the previously required erasing time of approximately 15 frames.

The term "black" level, as used herein, means a storage surface charge which is negative with respect to the cathode potential, and this charge is sufficient to just "cut-off" signal current. The term "white" level, as used herein, means that the storage surface is charged to a potential which is substantially at cathode potential.

A prior art storage tube erasing method, which is superficially similar to the erasing method of the present invention, involves writing over the entire surface of the storage target with a very high velocity electron beam to provide a uniform "whiter than white" level in which the potential on the surface of the insulating layer of the target becomes higher (more positive) than the potential of the target substrate. This "whiter than white" level, which covers up the previously stored information, is not obtained by a redistribution of secondary electrons, as in the present invention, but by the addition of new charge to the already present charge. In this prior art erasing method, the "whiter than white" level is then lowered to a "black" level over a time interval of many successive frames, as is conventional. This "whiter than white" level prior art erasing method has neither the advantage of significantly reducing the required erasing time nor the advantage of significantly reducing raster burn of the erasing method of the present invention.

Figure 2:
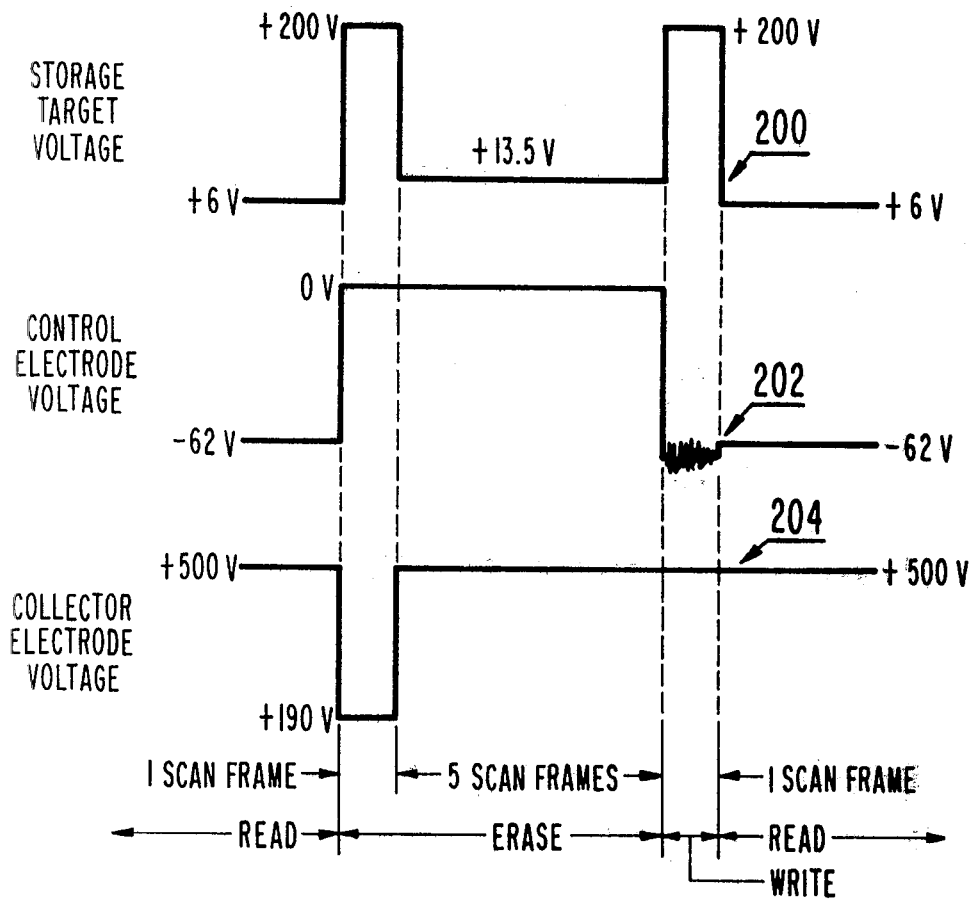

FIG. 1 is a block diagram of a typical storage tube together with means for operating the storage tube in its write, read and erase mode, and FIG. 2 is a graph of the typical potentials relative to the storage tube cathode potential applied respectively to the substrate of the storage target, the electron gun control electrode and the collector electrode of the storage tube in the performance of the method of the present invention during read, erase and write modes of operation, respectively.

Referring to FIG. 1, there is shown the combination of a storage tube 10 and block 100, which contains the write, read and erase means for the storage tube and the power supply therefor. For illustrative purposes, it is assumed that storage tube 10 is a silicon storage target tube of the type employing a silicon wafer target with a silicon oxide layer which was etched through to the silicon. More specifically, storage tube 10 comprises an evacuated envelope 12, which may be of any suitable material, such as glass. Within the envelope 12 is an electron beam gun 14 including a cathode 16, a control electrode 18 an accelerating anode 22 and a focusing electrode 25. A storage target 20 is disposed in the envelope 12 opposite the electron gun 14.

Storage target 20 comprises an electrically conductive substrate 30 having disposed on a major surface 32 thereof a storage layer 34. The substrate 30 may consist of a semiconductor material, such as appropriately doped silicon. The storage layer 34 can consist essentially of a secondary electron-emissive insulating compound of a semiconductor material, preferably of the same kind of semiconductor material as that of substrate 30, e.g. that the dioxide or nitride of silicon, for example. The storage layer 34 is interrupted in a line or grid pattern so that the substrate semiconductor material is exposed to the electron beam. The substrate 30 is electrically connected to the target circuit and is the output signal electrode.

Between electron gun 14 and storage target 20, there is disposed a secondary electron collector electrode 48, which may be in the form of a mesh, supported on a collector support ring 50. The storage target 20 is electrically separated from the collector support ring 50 by an insulating spacer 52.

Disposed outside the envelope 12 are magnetic beam-focusing means 58 and magnetic beam deflecting means 60. Alternatively, electrostatic deflecting means (not shown) may be used.

As shown in FIG. 1, cathode 16 is connected to a point of reference potential. Respective potentials, relative to the reference potential of the cathode, are individually applied from block 100 to, control electrode 18, accelerating anode 22, focusing electrode 25, collector electrode 48, storage target substrate and signal electrode 30 over conductors 64, 66, 68, 70 and 72, respectively.

In operation, in accordance with the respective selected values of the potentials applied to conductors 64–72, inclusive, the electron gun 14 is employed to produce an electron beam 62, which at different times may be a writing beam, a reading beam or an erasing beam. The focusing means 58 and deflection means 60, respectively, focus and deflect the electron beam 62 to scan storage target 20 in raster fashion.

While operation of storage tube 10 in its write mode and in its read mode both follow the teachings of the prior art, it is the operation of storage tube in its erase mode which distinguishes the present invention from the prior art. More specifically, the erasure method of the present invention utilizes the fact that "raster burn" is diminished by operating the storage target near the collector potential and the fact that more effective erasure is obtained by choosing the proper relation between collector and storage target potentials for a portion of the erase cycle so that a uniform charge over the surface of the target insulator 36 is achieved by secondary electron redistribution.

Graphs 200, 202 and 204, respectively, of FIG. 2 show an example of the storage target voltage applied to target substrate 30 from block 100 over conductor 74; the control electrode voltage applied to control electrode 18 from block 100 over conductor 64, and the collector electrode voltage applied to collector 48 from block 100 over conductor 70, during the performance of a cycle of erase mode operation preceded by a cycle of read mode operation and followed, in turn, by a cycle of write mode operation and a subsequent cycle of read mode operation. The voltage applied from block 100 over conductors 66, 68 and 72 to operate storage tube 10 follow the teachings of the prior art and form no part of the present invention. During readout, an output signal manifesting the stored information is derived on conductor 72, as is conventional.

As shown in FIG. 2, the duration of an erase mode cycle of operation is six consecutive scan frames. During the first of these six consecutive scan frames, the control electrode 18 is operated at zero voltage, so that it has a potential substantially equal to the reference potential of cathode 16. Collector electrode 48 is operated at what is a relatively low positive potential for it, namely, about 190 volts. Storage target substrate 30 is operated at what is a relatively high positive potential for it, namely, about 200 volts. Thus, during the first scan frame of a cycle of erase mode operation, the storage target voltage is slightly positive (about 10 volts) with respect to the collector electrode voltage.

During the remaining five scan frames of a cycle of erase mode operation, control electrode 18 is retained at zero voltage. However, the potential of collector electrode 48 is raised to its normal positive voltage of about 500 volts and the potential of the storage target substrate 30 is lowered to a relatively small positive voltage of about 13.5 volts.

As is conventional, during a cycle of read mode operation control electrode 18 of electron gun 14 is maintained at a relatively high negative bias voltage, such as −62 volts, collector electrode 48 is maintained at its normal positive voltage of about 500 volts, while storage target substrate 30 is maintained at a slight positive voltage of about 6 volts. As is also conventional, in a cycle of write mode operation of a storage tube, a varying writing input is applied to control electrode 18 to vary the voltage of control electrode 18 about a predetermined negative bias potential. This predetermined bias potential has substantially the same negative value of −62 volts as that employed during read mode operation. However, during a cycle of write mode operation, the collector electrode is maintained at its normal positive potential of 500 volts and storage target substrate 30 is maintained at a relatively high positive potential of 200 volts with respect to cathode 16. Thus, the potential of the storage target is about 300 volts negative with respect to the potential of collector electrode 48 during write mode operation.

A redistribution of the electrical charges already present on the surface of storage insulator layer 36 to provide a uniform "white" level results during the first scan frame of a cycle of erase mode operation by the removal of the negative bias employed during the read and write modes of operation from control electrode 18, while storage target substrate 30 is maintained at a relatively high positive potential and the potential of the collector electrode 48 is reduced to a voltage which is slightly below (10 volts) that of the storage target voltage. During the remaining five scan frames of a cycle of erase mode operation, the value of the applied voltages in FIG. 2 are such that the storage surface charges toward cathode potential because the secondary emission ratio is then less than unity, as is known in the art.

The five scan frames, following the first scan frame of an erase cycle shown in FIG. 2, is more than sufficient to provide a complete erasure of any stored information. In fact, it has been found that complete erasure can normally be accomplished in a total of four television frames (133 milliseconds). Furthermore, it has been found that "raster burn" is significantly reduced by the erasing method of the present invention.

It should be noted that the operation described above was that used in evaluating the erase method. Component limitations prevented operation of the storage target above 200 volts. Without this restriction, equivalent erase performance can be obtained by maintaining the collector voltage at 500 volts and raising the target to 510 volts, for example. The important feature is to operate the target at a more positive potential than the collector potential in order to obtain secondary electron redistribution.

Generalizing, it is the operation of the storage target at a slightly more positive potential than the collector electrode (with both electrodes considerably above the first secondary emission cross-over e.g., considerably above 25 volts) which provides the advantage of the erasing method of the present invention. With the storage target (substrate) voltage more positive than the collector, the substrate becomes the most positive potential in the tube and since the secondary emission ratio is greater than unity, the substrate (target) acts as the collector electrode. Secondary electrons produced by the beam landing on the storage surface are therefore collected by the most positive potential in the tube, the substrate. The insulating surface then very quickly and very uniformly charges to the substrate voltage and no higher, since this is the most positive potential. This type of charging, where the insulating surface is charged to a uniform level essentially equal to the substrate voltage by secondary electrons, is termed "charging by secondary electron redistribution".

What is claimed is:
1. A method for erasing non-uniformly distributed electrical charges manifesting stored information which have already been written on the surface of a storage target of a storage tube, wherein said tube also comprises means including a cathode and control electrode for deriving an electron beam, means for scanning said beam over said target surface in a raster scan during each of a series of successive frames, and a collector electrode for collecting emitted secondary electrons from said surface of said storage target; said method comprising the steps of:
 a. individually applying a different respective one of a first set of predetermined potentials relative to the potential of said cathode to said control electrode, said collector electrode and said storage target for a first integral number of scanning frames, said predetermined potentials of said first set being selected to result in said storage target assuming a substantially uniform "white" level of stored electrical charges by secondary electron redistribution, and
 b. then individually applying a different respective one of a second set of predetermined potentials relative to the potential of said cathode to said control electrode, said collector electrode and said storage target for a second integral number of scanning frames, said predetermined potentials of said second set being selected to cause said stored electrical charges to be substantially dissipated from said storage target to thereby result in said storage target assuming a substantially uniform "black" level,
 c. wherein said predetermined potentials of said first set are such that said control electrode has a potential substantially equal to said cathode potential, said collector electrode has a first given positive potential relative to said cathode potential, and said storage target has a second given positive potential relative to said cathode potential which is slightly greater in magnitude than said first given collector potential, and wherein said predetermined potentials of said second set are such that said control electrode still has a potential substantially equal to said cathode potential, said collector has a third given positive potential relative to said cathode potential which is considerably higher in magnitude than both said first and second given positive potentials and said storage target has a fourth given positive potential relative to said cathode potential which is considerably smaller in magnitude than both said first and second given positive potentials.

2. The method defined in claim 1, wherein said first integral number is the number one and said second integral number is a number greater than one.

3. The method defined in claim 2, wherein said second integral number is no greater than the number five.

4. The method defined in claim 1, wherein said first given positive potential is substantially 190 volts, said second given positive potential is substantially 200 volts, said third given positive potential is substantially 500 volts and said fourth given positive potential is substantially 13.5 volts.

5. The method defined in claim 1, wherein said storage tube has a read mode of operation in which said control electrode has a fifth given negative potential relative to said cathode potential, said collector electrode has substantially said third given positive potential, and said storage target electrode has a sixth given positive potential which is slightly smaller in magnitude than said fourth given positive potential.

6. The method defined in claim 5, wherein said fifth given negative potential is substantially −62 volts, and said sixth given positive potential is substantially 6 volts.

7. The method defined in claim 5, wherein said storage tube has a write mode of operation in which said control electrode has a seventh negative potential relative to said cathode potential which varies in magnitude in accordance with a varying writing signal applied thereto about a bias potential substantially equal in magnitude to said fifth given negative potential, said collector electrode has substantially said third given positive potential, and said storage target has substantially said second given positive potential.

8. The method defined in claim 1, wherein said storage tube has a write mode of operation in which said control electrode has a fifth negative potential relative to said cathode potential which varies in magnitude in accordance with a varying writing signal applied thereto about a sixth given negative bias potential, said collector electrode has substantially said third given positive potential, and said storage target has substantially said second given positive potential.

* * * * *